(12) United States Patent
You et al.

(10) Patent No.: US 11,895,904 B2
(45) Date of Patent: Feb. 6, 2024

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Kuihua You, Hubei (CN); Jaehun Yang, Hubei (CN); Wei Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 486 days.

(21) Appl. No.: 17/285,058

(22) PCT Filed: Mar. 12, 2021

(86) PCT No.: PCT/CN2021/080430
§ 371 (c)(1),
(2) Date: Apr. 13, 2021

(87) PCT Pub. No.: WO2022/183521
PCT Pub. Date: Sep. 9, 2022

(65) Prior Publication Data
US 2023/0142422 A1    May 11, 2023

(30) Foreign Application Priority Data
Mar. 1, 2021  (CN) .......................... 202110226186.2

(51) Int. Cl.
*H10K 59/131*  (2023.01)
*H10K 77/10*  (2023.01)
(Continued)

(52) U.S. Cl.
CPC ............ *H10K 77/111* (2023.02); *B32B 3/266* (2013.01); *B32B 7/02* (2013.01); *B32B 7/022* (2019.01);
(Continued)

(58) Field of Classification Search
None
See application file for complete search history.

(56) References Cited

U.S. PATENT DOCUMENTS 10,466,637 B2 * 11/2019 Deno ................. G03G 15/5054
2018/0182829 A1 * 6/2018 Shin ...................... G06F 1/1652
(Continued)

FOREIGN PATENT DOCUMENTS

CN      109559639 A      4/2019
CN      110224081 A      9/2019
(Continued)

OTHER PUBLICATIONS

International Search Report in International application No. PCT/CN2021/080430, dated Dec. 2, 2021.
(Continued)

*Primary Examiner* — William C Trapanese

(57) ABSTRACT

The present disclosure provides a display panel. In the display panel, a first backplate is disposed in a terminal region; a flexible substrate including a first portion is disposed in the terminal region, wherein the first portion is disposed on the first backplate; a portion of a reinforcement layer is disposed on the flexible substrate and located in the terminal region; a first protective layer is disposed on the first portion, wherein the first protective layer and the reinforcement layer are disposed separately; and a second protective layer is disposed on the first protective layer and is connected to the reinforcement layer.

20 Claims, 3 Drawing Sheets

(51) Int. Cl.
  *B32B 7/022* (2019.01)
  *B32B 3/26* (2006.01)
  *B32B 7/02* (2019.01)
  *H10K 102/00* (2023.01)
  *B32B 7/12* (2006.01)
  *B32B 27/08* (2006.01)
  *B32B 27/28* (2006.01)
  *B32B 27/36* (2006.01)

(52) U.S. Cl.
  CPC .............. *H10K 59/131* (2023.02); *B32B 7/12* (2013.01); *B32B 27/08* (2013.01); *B32B 27/281* (2013.01); *B32B 27/36* (2013.01); *B32B 2457/20* (2013.01); *H10K 2102/311* (2023.02)

(56) References Cited

U.S. PATENT DOCUMENTS

| | | | |
|---|---|---|---|
| 2019/0318689 A1 | 10/2019 | Kim | |
| 2020/0020754 A1* | 1/2020 | Kim | H10K 77/111 |
| 2020/0051881 A1 | 2/2020 | Park et al. | |
| 2020/0185641 A1 | 6/2020 | Jeong et al. | |
| 2020/0388784 A1* | 12/2020 | Kim | H10K 50/84 |
| 2021/0013291 A1 | 1/2021 | Kim et al. | |

FOREIGN PATENT DOCUMENTS

| | | |
|---|---|---|
| CN | 110277435 A | 9/2019 |
| CN | 111402732 A | 7/2020 |
| CN | 113113421 A | 7/2021 |
| CN | 113270450 A | 8/2021 |
| CN | 113362706 A | 9/2021 |
| WO | 2020118893 A1 | 6/2020 |

OTHER PUBLICATIONS

Written Opinion of the International Search Authority in International application No. PCT/CN2021/080430, dated Dec. 2, 2021.
Chinese Office Action issued in corresponding Chinese Patent Application No. 202110226186.2 dated May 27, 2022, pp. 1-6.

* cited by examiner

DISPLAY PANEL

FIELD OF INVENTION

The present disclosure relates to the field of display technology, and more particularly to a display panel.

BACKGROUND OF INVENTION

In a process of research and practice of the prior art, the inventor of the present disclosure found that with a development of flexible display technology, product sizes have become larger and larger, and consequently sizes of a terminal region of display modules have gradually become larger. However, the larger the size of the terminal region is, the more easily an edge of the terminal region will warp during a bending process, and even cause a metal trace to break.

SUMMARY OF INVENTION

The embodiment of the present disclosure provides a display panel, which can reduce a risk of warpage of a terminal region and a breakage of a metal trace in the terminal region.

The present disclosure provides a display panel, including a display region, a bending region, and a terminal region, wherein the bending region is disposed between the display region and the terminal region, and the display panel further includes:
- a first backplate disposed in the terminal region;
- a flexible substrate comprising a first portion disposed in the terminal region, wherein the first portion is disposed on the first backplate;
- a reinforcement layer, wherein a portion of the reinforcement layer is disposed on the flexible substrate and located in the terminal region;
- a first protective layer disposed on the first portion, wherein the first protective layer and the reinforcement layer are disposed separately; and
- a second protective layer disposed on the first protective layer and connected to the reinforcement layer;
- wherein a boundary of a part of the second protective layer connected to the reinforcement layer is located in the terminal region, and a surface of the reinforcement layer, a surface of the first protective layer and a surface of the second protective layer define a space.

Optionally, in some embodiments of the present disclosure, a thickness of the first protective layer is greater than a thickness of the second protective layer.

Optionally, in some embodiments of the present disclosure, the thickness of the first protective layer is equal to a thickness of the reinforcement layer.

Optionally, in some embodiments of the present disclosure, an elastic modulus of the first protective layer is less than an elastic modulus of the second protective layer.

Optionally, in some embodiments of the present disclosure, a thickness of the first protective layer is less than a thickness of the second protective layer.

Optionally, in some embodiments of the present disclosure, the first protective layer and the second protective layer are an integrally formed structure.

Optionally, in some embodiments of the present disclosure, the display panel further comprises a circuit board disposed on the first portion, the first protective layer is provided with an opening, and the opening penetrates the first protective layer and the second protective layer; and a portion of the circuit board is arranged in the opening.

Optionally, in some embodiments of the present disclosure, a distance from the first protective layer to the reinforcement layer is in a range from 0.2 mm to 0.5 mm.

Optionally, in some embodiments of the present disclosure, the display panel further including:
- a transition region connected between the display region and the bending region;
- a second backplate; and
- a display portion;
- wherein the flexible substrate further comprises a second portion and a third portion connected to the first portion in sequence, the second portion is disposed in the transition region and the bending region, and the third portion is disposed in the display region; and
- wherein the third portion is disposed on the second backplate, the display portion is disposed on the third portion, and the reinforcement layer is disposed on the flexible substrate and extends from the transition region to the terminal region.

The present disclosure further providing a display panel including a display region, a bending region, and a terminal region, wherein the bending region is disposed between the display region and the terminal region, and the display panel further comprises:
- a first backplate disposed in the terminal region;
- a flexible substrate comprising a first portion disposed in the terminal region, wherein the first portion is disposed on the first backplate;
- a reinforcement layer, wherein a portion of the reinforcement layer is disposed on the flexible substrate and located in the terminal region;
- a first protective layer disposed on the first portion, wherein the first protective layer and the reinforcement layer are disposed separately; and
- a second protective layer disposed on the first protective layer and connected to the reinforcement layer.

Optionally, in some embodiments of the present disclosure, a boundary of a part of the second protective layer connected to the reinforcement layer is located in the terminal region.

Optionally, in some embodiments of the present disclosure, a thickness of the first protective layer is greater than a thickness of the second protective layer.

Optionally, in some embodiments of the present disclosure, the thickness of the first protective layer is equal to a thickness of the reinforcement layer.

Optionally, in some embodiments of the present disclosure, an elastic modulus of the first protective layer is less than an elastic modulus of the second protective layer.

Optionally, in some embodiments of the present disclosure, a thickness of the first protective layer is less than a thickness of the second protective layer.

Optionally, in some embodiments of the present disclosure, a surface of the reinforcement layer, a surface of the first protective layer and a surface of the second protective layer define a space.

Optionally, in some embodiments of the present disclosure, the first protective layer and the second protective layer are an integrally formed structure.

Optionally, in some embodiments of the present disclosure, the display panel further comprises a circuit board disposed on the first portion, the first protective layer is provided with an opening, and the opening penetrates the first protective layer and the second protective layer; and a portion of the circuit board is arranged in the opening.

Optionally, in some embodiments of the present disclosure, a distance from the first protective layer to the reinforcement layer is in a range from 0.2 mm to 0.5 mm.

Optionally, in some embodiments of the present disclosure, the display panel further including a transition region connected between the display region and the bending region;
  a second backplate; and
  a display portion;
  wherein the flexible substrate further comprises a second portion and a third portion connected to the first portion in sequence, the second portion is disposed in the transition region and the bending region, and the third portion is disposed in the display region; and
  wherein the third portion is disposed on the second backplate, the display portion is disposed on the third portion, and the reinforcement layer is disposed on the flexible substrate and extends from the transition region to the terminal region.

In the terminal region of the display panel of the embodiment of the present disclosure, the first protective layer and the second protective layer are disposed on the flexible substrate, and the second protective layer is connected with the reinforcement layer to reduce a warpage of the terminal area and a risk of breaking the metal trace on the flexible substrate.

DESCRIPTION OF FIGURES

In order to more clearly describe the technical solutions in the embodiments of the present disclosure, the following will briefly introduce the figures needed in the description of the embodiments. Obviously, the figures in the following description are only some embodiments of the present disclosure. For those skilled in the art, without inventive steps, other figures can be obtained based on these figures.

Figure 1:
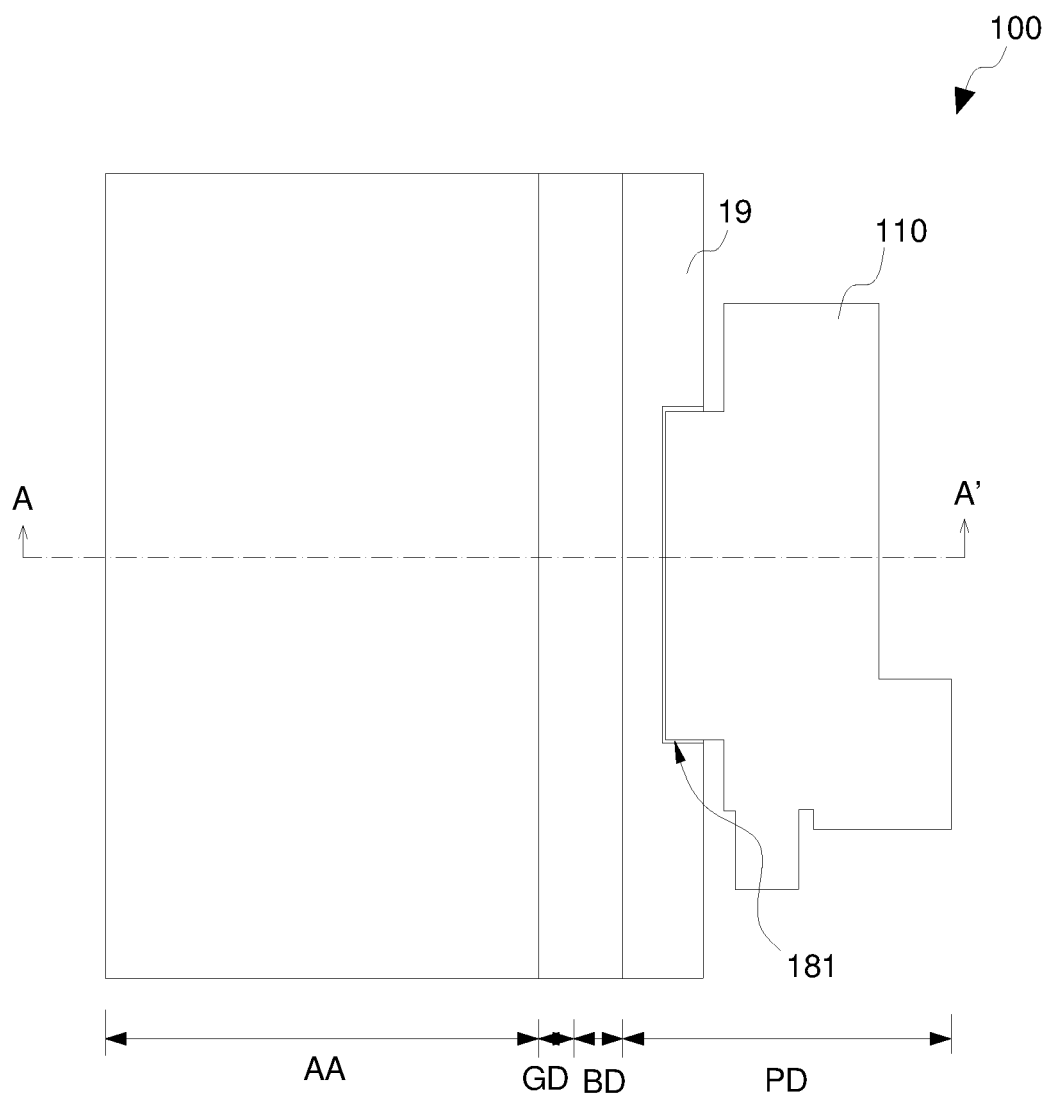
FIG. 1 is a schematic top view of a structure of a display panel provided by one embodiment of the present disclosure.
Figure 2:
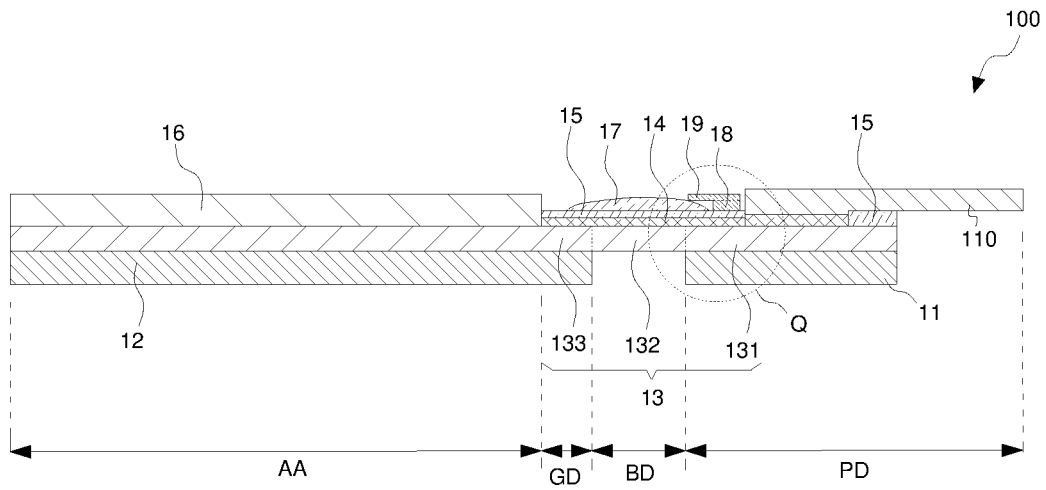
FIG. 2 is a schematic structural diagram of the display panel in a flat state provided in one embodiment of the present disclosure.

It should be noted that FIG. 2 is also a schematic cross-sectional structure view along a line AA' in FIG. 1.

DETAILED DESCRIPTION OF PREFERRED EMBODIMENTS

The technical solutions in the embodiments of the present disclosure will be clearly and completely described below in conjunction with the figures in the embodiments of the present disclosure. Obviously, the described embodiments are only a part of the embodiments of the present disclosure, rather than all the embodiments. Based on the embodiments in the present disclosure, all other embodiments obtained by those skilled in the art without inventive steps fall within the protection scope of the present disclosure. In addition, it should be understood that the specific embodiments described here are only used to illustrate and explain the present disclosure, and are not used to limit the present disclosure. In the present disclosure, unless otherwise stated, the directional words used such as "upper" and "lower" generally refer to an upper direction and a lower direction of the device in actual use or operating state, and specifically refer to a direction in the figures; and "an inner" and "an outer" refer to an outline of the device.

The embodiment of the present disclosure provides a display panel, which will be described in detail below. It should be noted that the display panel of this embodiment may be an organic light emitting diode (OLED) display panel, a quantum dot light emitting diode (QLED) display panel, and the like. The display panel of the embodiment of the present disclosure may also be a mini-LED display panel or a micro-LED display panel. In this embodiment, the display panel is the OLED display panel as an example for description, but it is not limited to this.

Figure 3:
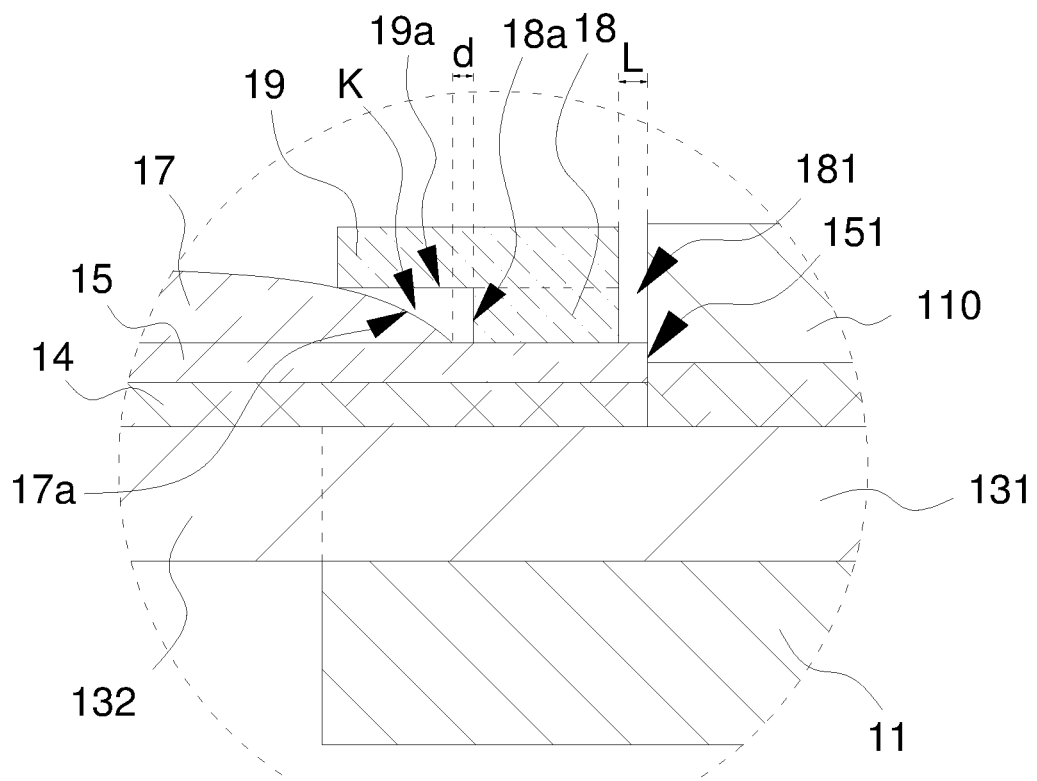
FIG. 3 is an enlarged view of portion Q in FIG. 2.
Figure 4:
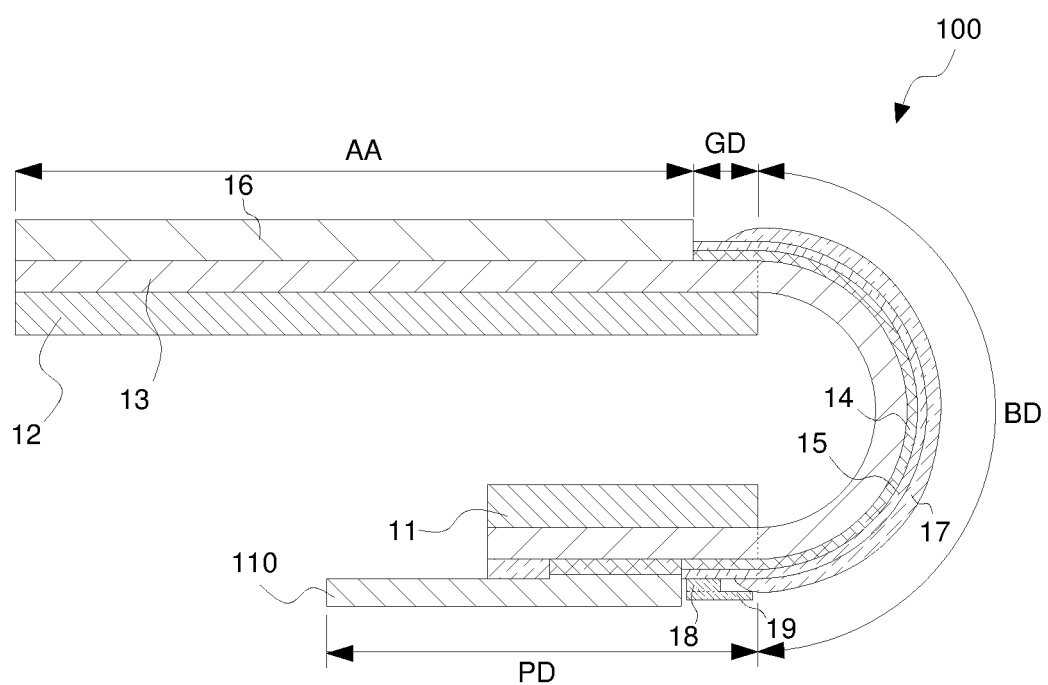
FIG. 4 is a schematic structural diagram of the display panel in a bent state according to one embodiment of the present disclosure.

Please refer to FIGS. 1 to 4, FIG. 1 is a schematic top view of a structure of a display panel provided by one embodiment of the present disclosure; FIG. 2 is a schematic structural diagram of the display panel in a flat state provided in one embodiment of the present disclosure; FIG. 3 is an enlarged view of portion Q in FIG. 2; FIG. 4 is a schematic structural diagram of the display panel in a bent state according to one embodiment of the present disclosure.

One embodiment of the present disclosure provides a display panel 100, which includes a display region AA, a transition region GD, a bending region BD, and a terminal region PD that are sequentially connected. The bending region BD is disposed between the display region AA and the terminal region PD. The display panel 100 includes a first backplate 11, a second backplate 12, a flexible substrate 13, a metal trace 14, an insulating layer 15, a display portion 16, a reinforcement layer 17, a first protective layer 18, a second protective layer 19, and a circuit board 110. The flexible substrate 13 includes a first portion 131, a second portion 132, and a third portion 133 that are connected in sequence. The first portion 131 is disposed in the terminal region PD. The second portion 132 is disposed in the bending region BD and the transition region GD. The third portion 133 is disposed in the display region AA. Among them, the first portion 131, the second portion 132, and the third portion 133 may be an integrally formed structure.

In the display region AA of the display panel 100, the second backplate 12, the third portion 133 of the flexible substrate 13, and the display portion 16 are stacked in sequence. The display portion 16 includes a driving circuit structure layer, a light emitting device layer, and an encapsulation layer, wherein the driving circuit structure layer includes a thin film transistor, the light emitting device layer includes an anode, a light emitting layer, and a cathode. Since the driving circuit structure layer and the light emitting device layer are in the prior art, they will not be repeated here.

In the transition region GD of the display panel 100, the second portion 132 of the flexible substrate 13, the metal trace 14, the insulating layer 15, and the reinforcement layer 17 on the second backplate 12 are stacked in sequence. The metal trace 14 is electrically connected to the display portion 16 and the circuit board 110.

In the bending region BD of the display panel 100, the second portion 132 of the flexible substrate 13, the metal trace 14, the insulating layer 15, and the reinforcement layer 17 are stacked in sequence. The metal trace 14 is electrically connected to the display portion 16 and the circuit board 110.

In the terminal region PD of the display panel 100, the first backplate 11, the first portion 131 of the flexible substrate 13, a portion of the metal wiring 14, a portion of the insulating layer 15, the first protective layer 18, and the second protective layer 19 are stacked in this order. In addition, the circuit board 110 is also arranged on the flexible substrate 13; specifically, the circuit board 110 is arranged on the insulating layer 15. A portion of the reinforcement layer 17 is provided on the insulating layer 15. The insulating layer 15 is provided with an opening 151 that exposes the conductive pad, so that the circuit board 110 is electrically connected to the conductive pad. The conductive pad is electrically connected to the metal trace 14.

Specifically, the first backplate 11 is disposed in the terminal region PD. The flexible substrate 13 includes a first portion 131 disposed in the terminal region PD. The first portion 131 is disposed on the first backplate 11.

The reinforcement layer 17 is disposed on the flexible substrate 13 and located in the terminal region PD.

The first protective layer 18 is disposed on the first portion 131. The first protective layer 18 and the reinforcement layer 17 are arranged separately. The second protective layer 19 is disposed on the first protective layer 18. The second protective layer 19 is connected to the reinforcement layer 17.

In the terminal region PD of the display panel 100 of the embodiment of the present disclosure, by providing the first protective layer 18 and the second protective layer 19 on the flexible substrate 13 and connecting the second protective layer 19 to the reinforcement layer 17, a warpage of the terminal region PD and a risk of breaking the metal trace 14 on the flexible substrate 13 are reduced.

Specifically, the first protective layer 18 and the second protective layer 19 are disposed on the flexible substrate 13 to improve a stiffness of the display panel 100 in the terminal region PD, thereby reducing the risk of warping of the display panel 100 in the terminal section PD, and at the same time it also plays a role in protecting the metal trace 14.

Optionally, the elastic modulus of the first protective layer 18 and the second protective layer 19 are both greater than the elastic module of the first backplate 11, so as to suppress a warpage of the first backplate 11, thereby reducing a risk of warping the terminal region PD of the display panel 100.

In this embodiment, a surface 17*a* of the reinforcement layer 17, a surface 18*a* of the first protective layer 18, and a surface 19*a* of the second protective layer 19 define a space K. When the display panel 100 is in a bent state, a terminal of the first backplate 11 will be squeezed against the flexible substrate 13, so that a portion of the terminal region PD close to the bending region BD is subjected to greater stress, and because the space K is close to the bending region BD, therefore the space K plays a role in releasing stress.

In some embodiments, the space K is filled with a flexible material to reduce a risk of breakage and separation of the suspended part of the second protective layer 19.

In addition, separating the first protective layer 18 and the reinforcement layer 17 can prevent the first protective layer 18 from being attached to the reinforcement layer 17, and thereby prevent affecting the attachment effect of the second protective layer 19 to the reinforcement layer 17.

Optionally, a distance d from the first protective layer 18 to the reinforcement layer 17 is in a range from 0.2 mm to 0.5 mm. Optionally, the distanced may be 0.2 mm, 0.3 mm, 0.4 mm, and 0.5 mm.

In the display panel 100 of this embodiment, a boundary of the portion where the second protective layer 19 is connected to the reinforcement layer 17 is located in the terminal region PD. Specifically, the boundary of the portion where the second protective layer 19 is connected to the reinforcement layer 17 is located within an outer contour line of the first backplate 11. This arrangement prevents the second protective layer 19 from extending to the bending area BD, and prevents affecting the bending effect of the display panel 100.

In the display panel 100 of this embodiment, a thickness of the first protective layer 18 is equal to a thickness of the reinforcement layer 17. This arrangement is convenient for attaching the second protective layer 19 to the reinforcement layer 17.

In some embodiments, the thickness of the first protective layer 18 may also be less than or greater than the thickness of the reinforcement layer 17.

In the display panel 100 of this embodiment, the thickness of the first protective layer 18 is less than the thickness of the second protective layer 19. Since the first protective layer 18 fails to completely cover the metal trace 14, a protective effect of a portion of the metal trace 14 not covered by the first protective layer 18 is relatively weak. Therefore, setting the second protective layer 19 thicker can improve a protective effect of the second protective layer 19 on the portion of the metal trace 14 corresponding to the space K.

In some embodiments, the thickness of the first protective layer 18 may also be greater than the thickness of the second protective layer 19. Since the thickness of the second protective layer 19 is thinner and the flexibility of the second protective layer 19 is better, the second protective layer 19 can be easily attached to the curved surface of the reinforcement layer 17, which can improve a tightness of the second protective layer 19 attached to the reinforcement layer 17, and reduce a risk of the second protective layer 19 and the reinforcement layer 17 from being separated due to the bending of the display panel 100.

In the display panel 100 in this embodiment, the thickness of the first protective layer 18 is in a range from 50 μm to 80 μm. For example, the thickness of the first protective layer 18 may be 50 μm, 60 μm, 70 μm, and 80 μm. The thickness of the second protective layer 19 is in a range from 50 μm to 100 μm. For example, the thickness of the second protection layer 19 may be 50 μm, 60 μm, 70 μm, 80 μm, 90 μm, and 100 μm.

In the display panel 100 of this embodiment, the elastic modulus of the first protective layer 18 is less than the elastic modulus of the second protective layer 19. Since the first protective layer 18 fails to completely cover the metal trace 14, the protection of the parts of the metal trace 14 that are not covered is relatively weak. Therefore, the second protective layer 19 with a greater elastic modulus can be selected to increase a rigidity of the second protective layer 19, and further improves the protective effect of the second protective layer 19 on the portion of the metal trace 14 corresponding to the space K.

In the display panel 100 of this embodiment, the first protective layer 18 and the second protective layer 19 are made of the same material, and the first protective layer 18 and the second protective layer 19 are integrally formed. This arrangement is beneficial to improve the stability of the connection between the first protective layer 18 and the second protective layer 19, as well as to improve the efficiency of the first protective layer 18 and the second protective layer 19 being attached to the insulating layer 15 and the reinforcement layer 17, and to achieve an effect of simplifying the manufacturing process.

Optionally, the material of the first protective layer 18 and the second protective layer 19 may be materials such as polyethylene terephthalate (PET) or polyimide (PI).

In some embodiments, the first protective layer 18 and the second protective layer 19 may also be two independent film layers. The materials of the first protective layer 18 and the second protective layer 19 may also be different.

Optionally, the material of the reinforcement layer 17 is a curable material, such as ultraviolet curing glue, silica gel, or silicone glue.

In the display panel 100 of this embodiment, the circuit board 110 is disposed on the first portion 131. The first protective layer 18 is provided with an opening 181. The opening 181 penetrates the first protective layer 18 and the second protective layer 19. A portion of the circuit board 110 is provided in the opening 181. The opening 181 is provided to avoid the circuit board 110, improve the assembly efficiency of the circuit board 110, and save assembly space.

Optionally, a distance L from the hole wall of the opening 181 to the edge of the circuit board 110 is less than 1 mm. For example, the distance L can be 0.1 mm, 0.2 mm, 0.3 mm, 0.4 mm, 0.5 mm, 0.6 mm, 0.7 mm, 0.8 mm, and 0.9 mm.

Optionally, the circuit board 110 may be a flexible circuit board or a printed circuit board.

In the terminal region of the display panel of the embodiment of the present disclosure, the first protective layer and the second protective layer are arranged on the flexible substrate, and the second protective layer is connected to the reinforcement layer, to reduce the risk of warpage in the terminal region and breakage of the metal trace of the flexible substrate.

The above is a detailed introduction to the display panel provided by embodiments of the present disclosure. Specific embodiments are used in this article to describe the principles and implementations of the present disclosure. The description of the above embodiments is only used to help understand the methods and the core idea of the present disclosure. At the same time, for those skilled in the art, according to the idea of the present disclosure, there will be changes in the specific implementation and the scope of application. In summary, the content of this specification should not be construed as a limitation to the present disclosure.

What is claimed is:

1. A display panel, comprising a display region, a bending region, and a terminal region, wherein the bending region is disposed between the display region and the terminal region, and the display panel further comprises:
   a first backplate disposed in the terminal region;
   a flexible substrate comprising a first portion disposed in the terminal region, wherein the first portion is disposed on the first backplate;
   a reinforcement layer, wherein a portion of the reinforcement layer is disposed on the flexible substrate and located in the terminal region;
   a first protective layer disposed on the first portion, wherein the first protective layer and the reinforcement layer are disposed separately; and
   a second protective layer disposed on the first protective layer and connected to the reinforcement layer;
   wherein a boundary of a part of the second protective layer connected to the reinforcement layer is located in the terminal region, and a surface of the reinforcement layer, a surface of the first protective layer and a surface of the second protective layer define a space.

2. The display panel according to claim 1, wherein a thickness of the first protective layer is greater than a thickness of the second protective layer.

3. The display panel according to claim 2, wherein the thickness of the first protective layer is equal to a thickness of the reinforcement layer.

4. The display panel according to claim 2, wherein an elastic modulus of the first protective layer is less than an elastic modulus of the second protective layer.

5. The display panel according to claim 1, wherein a thickness of the first protective layer is less than a thickness of the second protective layer.

6. The display panel according to claim 1, wherein the first protective layer and the second protective layer are an integrally formed structure.

7. The display panel according to claim 1, wherein the display panel further comprises a circuit board disposed on the first portion, the first protective layer is provided with an opening, and the opening penetrates the first protective layer and the second protective layer; and
   a portion of the circuit board is arranged in the opening.

8. The display panel according to claim 1, wherein a distance from the first protective layer to the reinforcement layer is in a range from 0.2 mm to 0.5 mm.

9. The display panel according to claim 1, further comprising:
   a transition region connected between the display region and the bending region;
   a second backplate; and
   a display portion;
   wherein the flexible substrate further comprises a second portion and a third portion connected to the first portion in sequence, the second portion is disposed in the transition region and the bending region, and the third portion is disposed in the display region; and
   wherein the third portion is disposed on the second backplate, the display portion is disposed on the third portion, and the reinforcement layer is disposed on the flexible substrate and extends from the transition region to the terminal region.

10. A display panel, comprising a display region, a bending region, and a terminal region, wherein the bending region is disposed between the display region and the terminal region, and the display panel further comprises:
    a first backplate disposed in the terminal region;
    a flexible substrate comprising a first portion disposed in the terminal region, wherein the first portion is disposed on the first backplate;
    a reinforcement layer, wherein a portion of the reinforcement layer is disposed on the flexible substrate and located in the terminal region;
    a first protective layer disposed on the first portion, wherein the first protective layer and the reinforcement layer are disposed separately; and
    a second protective layer disposed on the first protective layer and connected to the reinforcement layer.

11. The display panel according to claim 10, wherein a boundary of a part of the second protective layer connected to the reinforcement layer is located in the terminal region.

12. The display panel according to claim 10, wherein a thickness of the first protective layer is greater than a thickness of the second protective layer.

13. The display panel according to claim 12, wherein the thickness of the first protective layer is equal to a thickness of the reinforcement layer.

14. The display panel according to claim 12, wherein an elastic modulus of the first protective layer is less than an elastic modulus of the second protective layer.

15. The display panel according to claim 10, wherein a thickness of the first protective layer is less than a thickness of the second protective layer.

16. The display panel according to claim 10, wherein a surface of the reinforcement layer, a surface of the first protective layer and a surface of the second protective layer define a space.

17. The display panel according to claim 10, wherein the first protective layer and the second protective layer are an integrally formed structure.

18. The display panel according to claim 10, wherein the display panel further comprises a circuit board disposed on the first portion, the first protective layer is provided with an opening, and the opening penetrates the first protective layer and the second protective layer; and a portion of the circuit board is arranged in the opening.

19. The display panel according to claim 10, wherein a distance from the first protective layer to the reinforcement layer is in a range from 0.2 mm to 0.5 mm.

20. The display panel according to claim 10, further comprising:
- a transition region connected between the display region and the bending region;
- a second backplate; and
- a display portion;
- wherein the flexible substrate further comprises a second portion and a third portion connected to the first portion in sequence, the second portion is disposed in the transition region and the bending region, and the third portion is disposed in the display region; and
- wherein the third portion is disposed on the second backplate, the display portion is disposed on the third portion, and the reinforcement layer is disposed on the flexible substrate and extends from the transition region to the terminal region.

\* \* \* \* \*